(12) United States Patent
Fukuhara et al.

(10) Patent No.: US 11,923,823 B2
(45) Date of Patent: *Mar. 5, 2024

(54) ACOUSTIC WAVE DEVICE WITH HIGH THERMAL CONDUCTIVITY LAYER ON INTERDIGITAL TRANSDUCER

(71) Applicant: SKYWORKS SOLUTIONS, INC., Irvine, CA (US)

(72) Inventors: Hironori Fukuhara, Ibaraki (JP); Keiichi Maki, Suita (JP); Rei Goto, Osaka (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 576 days.

This patent is subject to a terminal disclaimer.

(21) Appl. No.: 17/224,343

(22) Filed: Apr. 7, 2021

(65) Prior Publication Data

US 2021/0226604 A1 Jul. 22, 2021

Related U.S. Application Data

(63) Continuation of application No. 16/674,689, filed on Nov. 5, 2019, now Pat. No. 11,025,220.

(Continued)

(51) Int. Cl.
*H03H 9/02* (2006.01)
*H03H 9/00* (2006.01)
(Continued)

(52) U.S. Cl.
CPC ...... *H03H 9/02834* (2013.01); *H03H 9/0009* (2013.01); *H03H 9/02228* (2013.01);
(Continued)

(58) Field of Classification Search
CPC .......... H03H 9/02834; H03H 9/02448; H03H 9/145; H03H 9/25; H03H 9/64
See application file for complete search history.

(56) References Cited

U.S. PATENT DOCUMENTS 7,466,061 B2 12/2008 Miura et al.
9,048,813 B2 6/2015 Iwasaki et al.
(Continued)

FOREIGN PATENT DOCUMENTS

IN 107317560 A 11/2017
JP 2011151638 A 8/2011

OTHER PUBLICATIONS

Search Report from corresponding United Kingdom Application No. 1916087.8 dated May 5, 2020.

*Primary Examiner* — Andrea Lindgren Baltzell
*Assistant Examiner* — Alan Wong
(74) *Attorney, Agent, or Firm* — Lando & Anastasi, LLP

(57) ABSTRACT

An acoustic wave device includes a piezoelectric substrate, interdigital transducer electrodes including a predetermined number of electrode fingers disposed on an upper surface of the substrate, and a dielectric material layer having a first portion and a second portion. The first portion is disposed on the upper surface of the substrate and between the interdigital transducer electrode fingers. The second portion is disposed above the interdigital transducer electrode fingers. The acoustic wave device further includes at least one thermally conductive bridge disposed within the dielectric material layer and contacting upper surfaces of at least two adjacent interdigital transducer electrode fingers to dissipate heat therefrom.

24 Claims, 16 Drawing Sheets

Related U.S. Application Data

(60) Provisional application No. 62/886,737, filed on Aug. 14, 2019, provisional application No. 62/756,310, filed on Nov. 6, 2018.

(51) Int. Cl.
  H03H 9/145 (2006.01)
  H03H 9/17 (2006.01)
  H03H 9/25 (2006.01)
  H03H 9/64 (2006.01)
  H03H 9/72 (2006.01)
  H04B 1/40 (2015.01)

(52) U.S. Cl.
  CPC .... H03H 9/02559 (2013.01); H03H 9/02637 (2013.01); H03H 9/02992 (2013.01); H03H 9/145 (2013.01); H03H 9/173 (2013.01); H03H 9/25 (2013.01); H03H 9/64 (2013.01); H03H 9/725 (2013.01); H04B 1/40 (2013.01)

(56) References Cited

U.S. PATENT DOCUMENTS

| | | | |
|---|---|---|---|
| 9,159,900 | B2 | 10/2015 | Tamasaki |
| 9,680,446 | B2 * | 6/2017 | Yasuda ............... H03H 9/6483 |
| 10,587,243 | B2 | 3/2020 | Park |
| 10,601,399 | B2 * | 3/2020 | Kawasaki .......... H03H 9/02992 |
| 10,622,964 | B2 | 4/2020 | Kawasaki |
| 11,025,220 | B2 * | 6/2021 | Fukuhara ............... H03H 9/173 |
| 11,133,789 | B2 * | 9/2021 | Maki .................. H03H 9/02834 |
| 11,588,465 | B2 * | 2/2023 | Fukuhara ............. H03H 9/6406 |
| 2007/0278898 | A1 | 12/2007 | Miura et al. |
| 2018/0159499 | A1 | 6/2018 | Nakazawa et al. |
| 2020/0028487 | A1 | 1/2020 | Caron |
| 2020/0144984 | A1 | 5/2020 | Fukuhara et al. |

* cited by examiner

ACOUSTIC WAVE DEVICE WITH HIGH THERMAL CONDUCTIVITY LAYER ON INTERDIGITAL TRANSDUCER

CROSS-REFERENCE TO RELATED APPLICATIONS

This application claims priority under 35 U.S.C. § 120 as a continuation of U.S. patent application Ser. No. 16/674,689, titled "ACOUSTIC WAVE DEVICE WITH HIGH THERMAL CONDUCTIVITY LAYER ON INTERDIGITAL TRANSDUCER" filed Nov. 5, 2019, which claims priority under 35 U.S.C. § 119(e) to U.S. provisional patent application Ser. No. 62/756,310, titled "ACOUSTIC WAVE DEVICE WITH HIGH THERMAL CONDUCTIVITY LAYER ON INTERDIGITAL TRANSDUCER," filed Nov. 6, 2018 and to U.S. provisional patent application Ser. No. 62/886,737, titled "ACOUSTIC WAVE DEVICE WITH HIGH THERMAL CONDUCTIVITY LAYER ON INTERDIGITAL TRANSDUCER," filed Aug. 14, 2019. Each of these applications is incorporated herein by reference in its entirety for all purposes.

BACKGROUND

Technical Field

Embodiments of this disclosure relate to acoustic wave devices and heat dissipation structures for same.

Description of Related Technology

Acoustic wave devices, for example, surface acoustic wave (SAW) and bulk acoustic wave (BAW) devices may be utilized as components of filters in radio frequency electronic systems. For instance, filters in a radio frequency front end of a mobile phone can include acoustic wave filters. Two acoustic wave filters can be arranged as a duplexer.

SUMMARY

In accordance with one aspect, there is provided an acoustic wave device. The acoustic wave device comprises a piezoelectric substrate, interdigital transducer electrodes including a predetermined number of electrode fingers disposed on an upper surface of the substrate, a dielectric material layer having a first portion and a second portion, the first portion disposed on the upper surface of the substrate and between the interdigital transducer electrode fingers, the second portion disposed above the interdigital transducer electrode fingers, and at least one thermally conductive bridge disposed within the dielectric material layer and contacting upper surfaces of at least two adjacent interdigital transducer electrode fingers to dissipate heat therefrom.

In some embodiments, the first portion of the dielectric material has a different composition than the second portion of the dielectric material.

In some embodiments, the thermally conductive bridge includes a heat dissipating layer and cap layers disposed on the upper surfaces of the at least two adjacent interdigital transducer electrode fingers. The heat dissipating layer may include a material having a higher thermal conductivity than the dielectric material. The cap layers may include a material having a higher thermal conductivity than the dielectric material. The heat dissipating layer may be formed of a different material than the cap layers. The heat dissipating layer may be formed of a same material as the cap layers.

The heat dissipating layer may have an electrical resistance sufficiently high to prevent short circuits between adjacent interdigital transducer electrodes though the heat dissipating layer. The heat dissipating layer may be formed from a ceramic material. The heat dissipating layer may be formed from one of silicon nitride, aluminum nitride, aluminum oxide, spinel, or diamond.

In some embodiments, the heat dissipating layer is thinner than the interdigital transducer electrodes and thinner than the dielectric material layer. The cap layers may be thinner than the interdigital transducer electrodes and thinner than the dielectric material layer. The cap layers may be between 10 nm and 50 nm thick. The heat dissipating layer may be between 10 nm and 200 nm thick.

In some embodiments, the heat dissipating layer is disposed between the first portion of the dielectric material and the second portion of the dielectric material.

In some embodiments, the thermally conductive bridge covers an area in which the interdigital transducer electrodes are interleaved. The thermally conductive bridge may further cover portions of bus bar electrodes from which the interdigital transducer electrodes extend. The thermally conductive bridge may further cover reflector electrodes disposed on opposite sides of the interdigital transducer electrodes. The thermally conductive bridge may include a plurality of separate heat dissipating layers covering different respective portions of the interdigital transducer electrodes.

In some embodiments, the acoustic wave device comprises a surface acoustic wave device. The acoustic wave device may further comprise dummy electrode fingers.

In some embodiments, the acoustic wave device comprises a Lamb mode acoustic wave device.

In accordance with another aspect, there is provided an acoustic wave resonator. The acoustic wave resonator comprises a piezoelectric substrate, interdigital transducer electrodes disposed on an upper surface of the substrate, cap layers disposed on upper surfaces of the interdigital transducer electrodes, a dielectric material layer disposed on the upper surface of the substrate and on the interdigital transducer electrodes, and a heat dissipating layer disposed within the dielectric material layer and in contact with the cap layers, the heat dissipating layer separating the dielectric material layer into an upper layer and a lower layer.

In some embodiments, the acoustic wave resonator comprises a surface acoustic wave resonator.

In some embodiments, the acoustic wave resonator comprises a Lamb mode acoustic wave resonator.

In accordance with another aspect, there is provided a radio frequency filter including an acoustic wave resonator. The acoustic wave resonator comprises a piezoelectric substrate, interdigital transducer electrodes including a predetermined number of electrode fingers disposed on an upper surface of the substrate, a dielectric material layer having a first portion and a second portion, the first portion disposed on the upper surface of the substrate and between the interdigital transducer electrode fingers, the second portion disposed above the interdigital transducer electrode fingers, and at least one thermally conductive bridge disposed within the dielectric material layer and contacting upper surfaces of at least two adjacent interdigital transducer electrode fingers to dissipate heat therefrom.

In some embodiments, the acoustic wave resonator comprises a surface acoustic wave resonator.

In some embodiments, the acoustic wave resonator comprises a Lamb mode acoustic wave resonator.

In accordance with another aspect, there is provided an electronics module including a radio frequency filter including an acoustic wave resonator. The acoustic wave resonator comprises a piezoelectric substrate, interdigital transducer electrodes including a predetermined number of electrode fingers disposed on an upper surface of the substrate, a dielectric material layer having a first portion and a second portion, the first portion disposed on the upper surface of the substrate and between the interdigital transducer electrode fingers, the second portion disposed above the interdigital transducer electrode fingers, and at least one thermally conductive bridge disposed within the dielectric material layer and contacting upper surfaces of at least two adjacent interdigital transducer electrode fingers to dissipate heat therefrom.

In some embodiments, the acoustic wave resonator comprises a surface acoustic wave resonator.

In some embodiments, the acoustic wave resonator comprises a Lamb mode acoustic wave resonator.

In accordance with another aspect, there is provided an electronic device. The electronic device comprises an electronics module including a radio frequency filter, the radio frequency filter including an acoustic wave resonator. The acoustic wave resonator includes a piezoelectric substrate, interdigital transducer electrodes including a predetermined number of electrode fingers disposed on an upper surface of the substrate, a dielectric material layer having a first portion and a second portion, the first portion disposed on the upper surface of the substrate and between the interdigital transducer electrode fingers, the second portion disposed above the interdigital transducer electrode fingers, and at least one thermally conductive bridge disposed within the dielectric material layer and contacting upper surfaces of at least two adjacent interdigital transducer electrode fingers to dissipate heat therefrom.

In some embodiments, the acoustic wave resonator comprises a surface acoustic wave resonator.

In some embodiments, the acoustic wave resonator comprises a Lamb mode acoustic wave resonator.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1A:
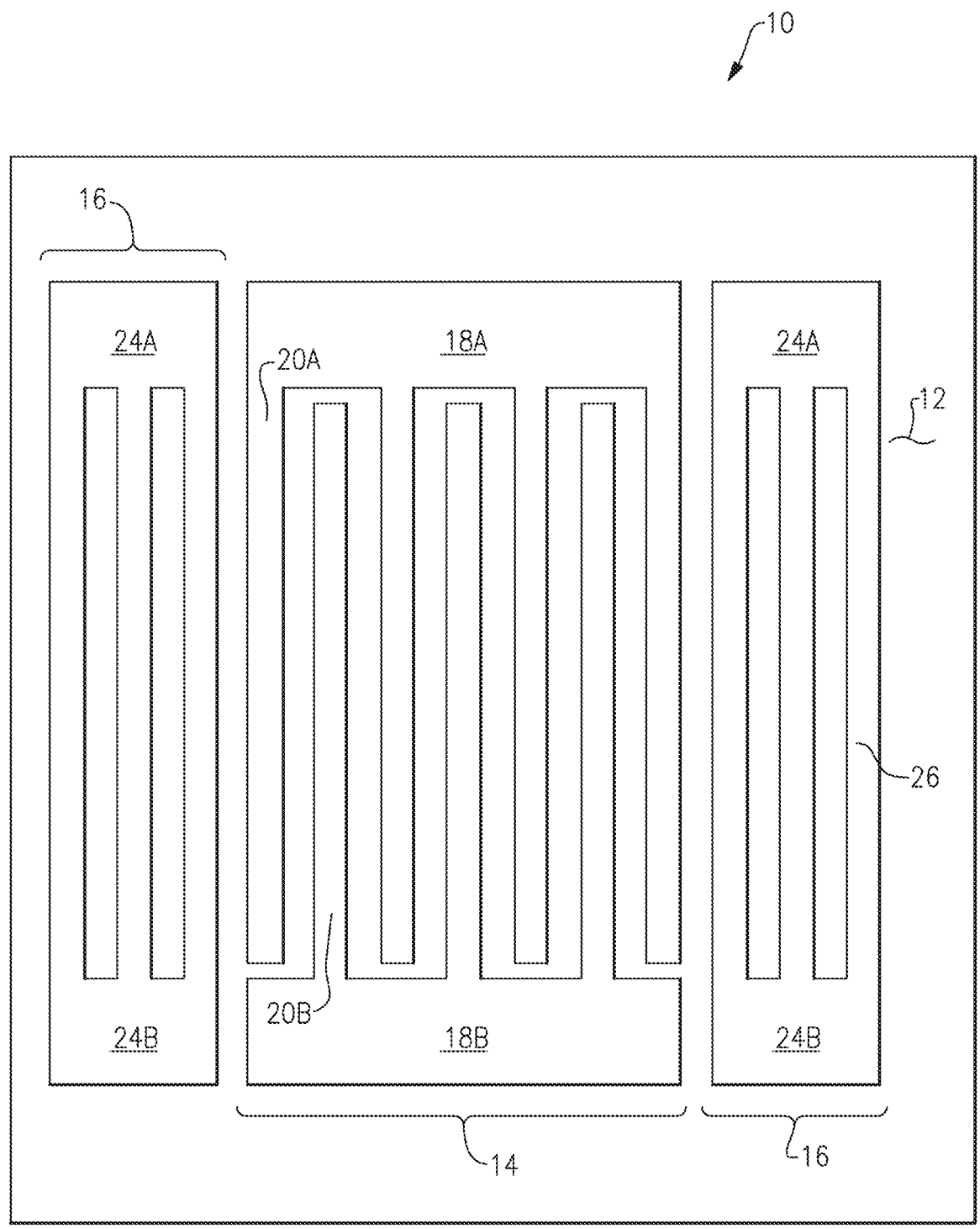
FIG. 1A is a simplified plan view of an example of a surface acoustic wave resonator.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1A is a plan view of a surface acoustic wave (SAW) resonator 10 such as might be used in a SAW filter, duplexer, balun, etc.

Acoustic wave resonator 10 is formed on a piezoelectric substrate, for example, a lithium tantalate (LiTaO$_3$) or lithium niobate (LiNbO$_3$) substrate 12 and includes Interdigital Transducer (IDT) electrodes 14 and reflector electrodes 16. In use, the IDT electrodes 14 excite a main acoustic wave having a wavelength λ along a surface of the piezoelectric substrate 12. The reflector electrodes 16 sandwich the IDT electrodes 14 and reflect the main acoustic wave back and forth through the IDT electrodes 14. The main acoustic wave of the device travels perpendicular to the lengthwise direction of the IDT electrodes.

The IDT electrodes 14 include a first bus bar electrode 18A and a second bus bar electrode 18B facing first bus bar electrode 18A. The bus bar electrodes 18A, 18B may be referred to herein and labelled in the figures as busbar electrode 18. The IDT electrodes 14 further include first electrode fingers 20A extending from the first bus bar electrode 18A toward the second bus bar electrode 18B, and second electrode fingers 20B extending from the second bus bar electrode 18B toward the first bus bar electrode 18A.

The reflector electrodes 16 (also referred to as reflector gratings) each include a first reflector bus bar electrode 24A and a second reflector bus bar electrode 24B (collectively referred to herein as reflector bus bar electrode 24) and reflector fingers 26 extending between and electrically coupling the first bus bar electrode 24A and the second bus bar electrode 24B.

Figure 1B:
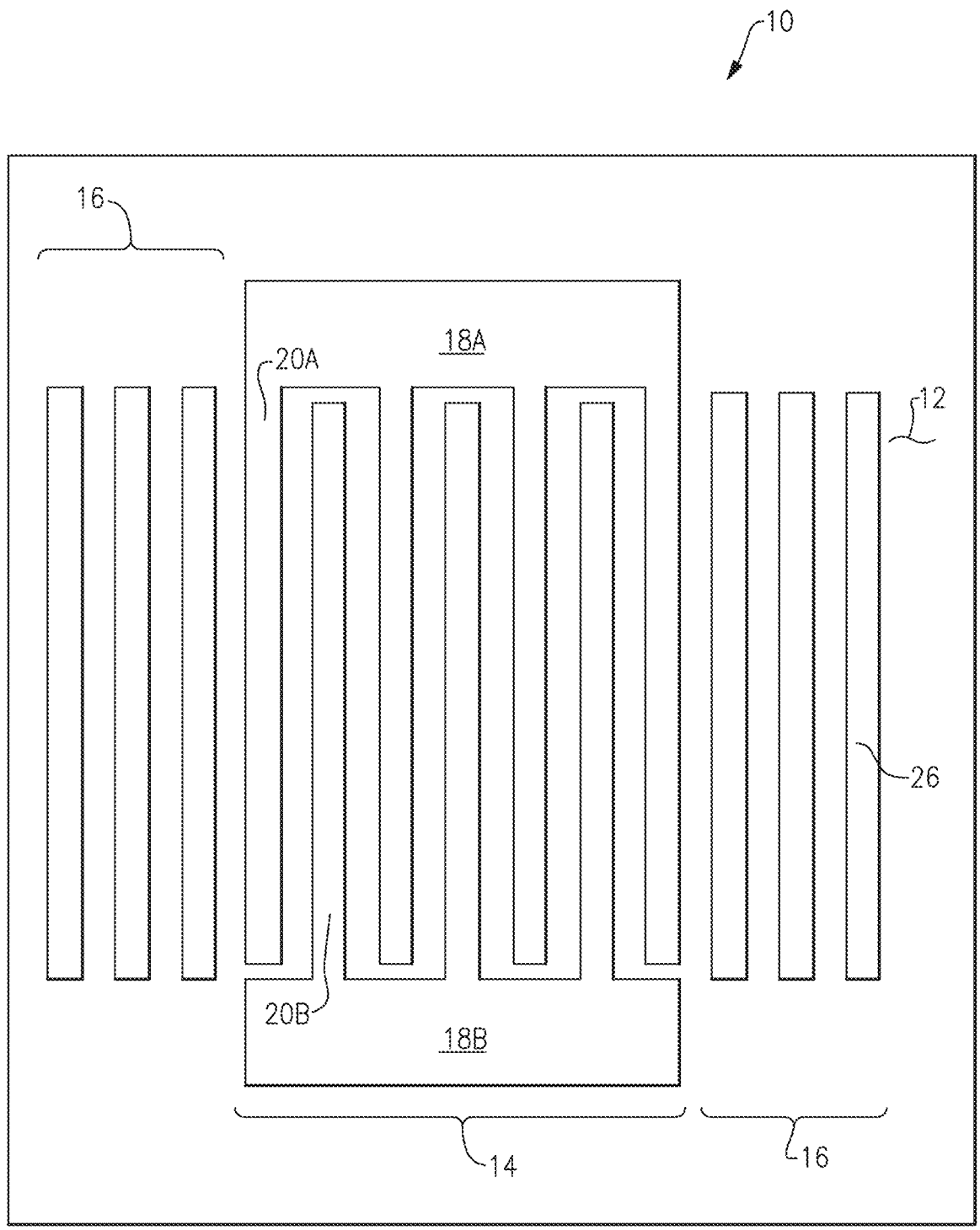
FIG. 1B is a simplified plan view of another example of a surface acoustic wave resonator.
Figure 1C:
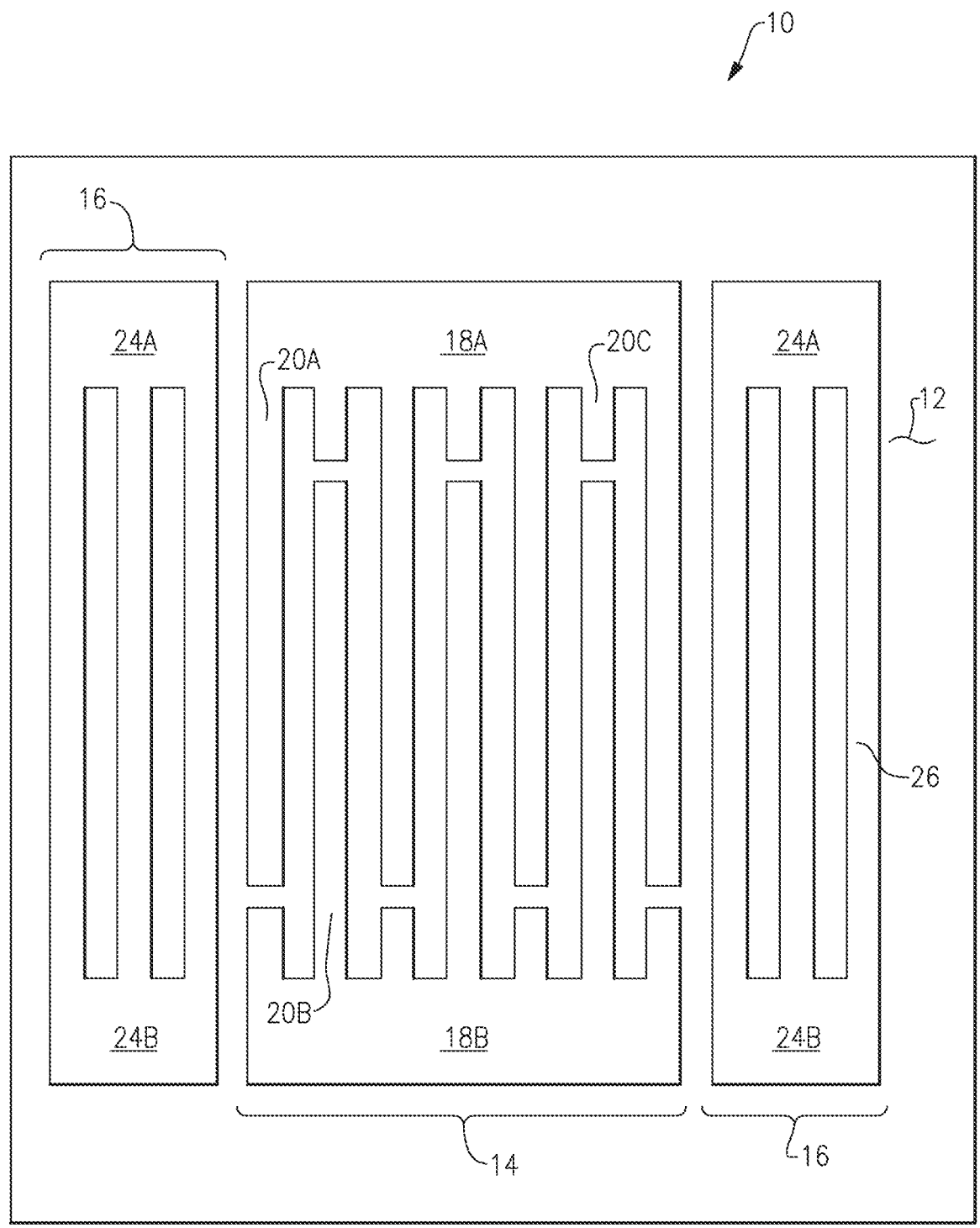
FIG. 1C is a simplified plan view of another example of a surface acoustic wave resonator.

In other embodiments disclosed herein, as illustrated in FIG. 1B, the reflector bus bar electrodes 24A, 24B may be omitted and the reflector fingers 26 may be electrically unconnected. Further, as illustrated in FIG. 1C, acoustic wave resonators as disclosed herein may include dummy electrode fingers 20C that are aligned with respective electrode fingers 20A, 20B. Each dummy electrode finger 20C extends from the opposite bus bar electrode 18A, 18B than the respective electrode finger 20A, 20B with which it is aligned.

SAW devices, for example, the acoustic wave resonator 10 of FIG. 1, typically generate heat during operation. Sources of heat may include, for example, Joule heating of the IDT electrodes 14 due to the passage of current through the electrodes. Operating parameters of SAW devices often vary with temperature. For example, in a radio frequency filter formed of SAW resonators, the resonant and anti-resonant frequencies of the filter may both decrease with temperature. Temperature dependence of parameters of a SAW device is undesirable because one typically would desire a device that operated consistently under different operating conditions. Accordingly, it may be desirable to dissipate heat generated in a SAW device in operation as quickly and efficiently as possible to keep the device from heating up to a temperature at which the operating parameters of the device shift more than an acceptable amount.

Figure 2:
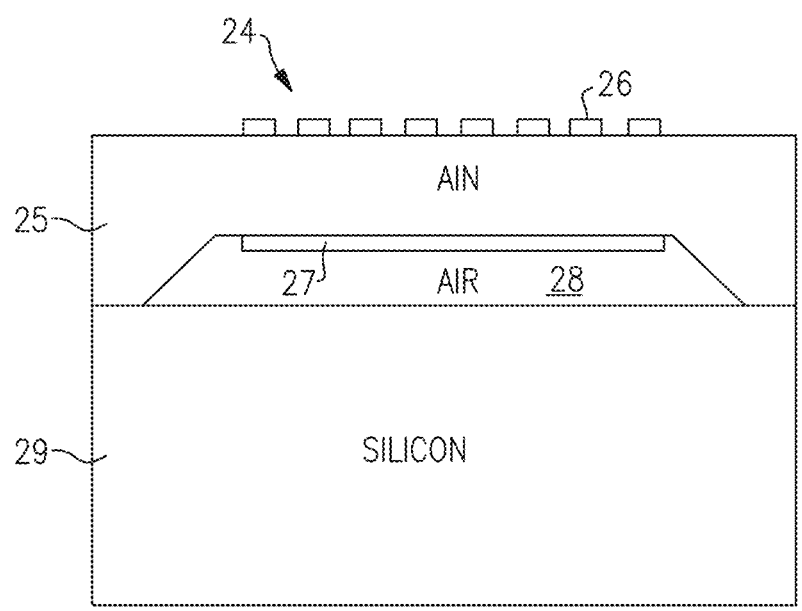
FIG. 2 is a cross-sectional view of a portion of a Lamb mode acoustic wave resonator.

It should also be appreciated that although aspects and embodiments disclosed herein are discussed in the context of a SAW resonator, the present disclosure is equally applicable to other forms of acoustic waver resonators, for example, Lamb mode acoustic wave resonators, also referred to herein as a Lamb mode resonator or Lamb mode device. A Lamb mode acoustic wave resonator typically includes interdigital transducer (IDT) electrodes similar to a SAW resonator. For example, Lamb wave resonators also generally include an IDT electrode structure formed on a piezoelectric substrate and can benefit from a high thermal conductivity layer formed atop the IDT electrodes as disclosed herein. Examples of Lamb mode resonators that aspects and embodiments disclosed herein may be utilized in conjunction with are disclosed in commonly assigned U.S. patent application Ser. No. 16/515,302, filed on Jul. 18, 2019. One example of a Lamb mode acoustic wave resonator is shown in cross-section in FIG. 2. The Lamb mode acoustic wave resonator of FIG. 2 is illustrated without any dielectric film covering the IDT electrodes, but it should be appreciated that the configurations of dielectric films covering the substrates and/or IDT electrodes of SAW resonators as disclosed herein are equally applicable to a Lamb mode acoustic wave resonator. The Lamb wave resonator 24 includes features of a SAW resonator and a film bulk acoustic resonator. As illustrated, the Lamb wave resonator 24 includes a piezoelectric layer 25, interdigital transducer electrodes (IDT) 26 on the piezoelectric layer 25, and a lower electrode 27 disposed on a lower surface of the piezoelectric layer 25. The piezoelectric layer 25 can be a thin film. The piezoelectric layer 25 can be an aluminum nitride layer. In other instances, the piezoelectric layer 25 can be any suitable piezoelectric layer. The frequency of the Lamb wave resonator can be based on the geometry of the IDT 26. The electrode 27 can be grounded in certain instances. In some other instances, the electrode 27 can be floating. An air cavity 28 is disposed between the electrode 27 and a semiconductor substrate 29. Any suitable cavity can be implemented in place of the air cavity 28, for example, a vacuum cavity or a cavity filled with a different gas.

It should be appreciated that the acoustic wave resonators illustrated in FIGS. 1A-2, as well as those illustrated in other figures presented herein, are illustrated in a highly simplified form. The relative dimensions of the different features are not shown to scale. Further, typical acoustic wave resonators would commonly include a far greater number of electrode fingers and/or reflector fingers than illustrated. The acoustic wave resonators may be configured differently than illustrated in some examples, for example, to include dummy electrode fingers, electrode fingers with different or non-uniform length or width dimensions, electrode fingers or reflector fingers with different or non-uniform spacing, or electrode fingers that include bent or tilted portions. Typical acoustic wave resonators or filter elements may also include multiple IDT electrodes sandwiched between the reflector electrodes.

Figure 3:
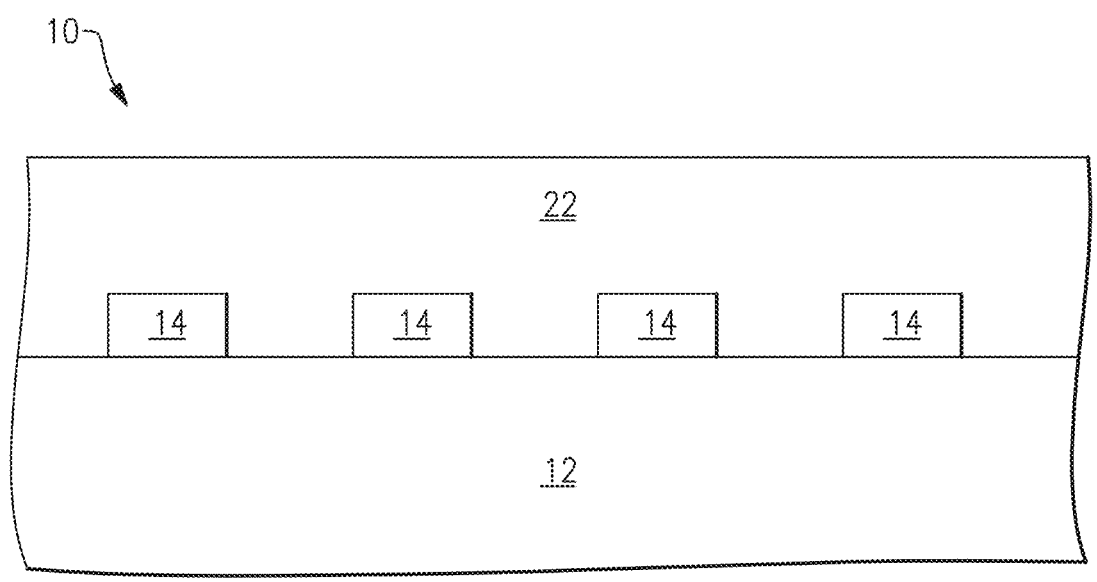
FIG. 3 is a cross-sectional view of a portion of a surface acoustic wave resonator.

FIG. 3 is a partial cross-sectional view of a portion of the acoustic wave resonator 10 of any of FIGS. 1A-1C illustrating a few of the IDT electrodes 14 disposed on the substrate 12. The IDT electrodes 14 are formed of a metal or metal alloy, for example, aluminum. In some embodiments the IDT electrodes 14 may include multiple layers of different metals, for example, molybdenum and aluminum. In many instances, a dielectric material 22, for example, silicon dioxide ($SiO_2$) may be disposed on top of the IDT electrodes 14 and substrate 12. The dielectric material may advantageously decrease the effect of changes in temperature upon operating characteristics of the acoustic wave resonator 10 and may protect the IDT electrodes 14 and surface of the substrate 14. The embodiment illustrated in FIG. 2 will be referred to herein as a Baseline configuration.

One problem with the Baseline configuration illustrated in FIG. 3 is that heat dissipation from the IDT electrodes 14 may be less than ideal. The dielectric material 22 may have a low thermal conductivity. Silicon dioxide, for example, has a thermal conductivity of about 1.4 W/mK. The material of the substrate 12 may also have a low thermal conductivity. Lithium tantalate, for example, has a thermal conductivity of about 2.93 W/mK. Accordingly, heat generated during operation of the acoustic wave resonator 10 may build up about the IDT electrodes 14, resulting in localized heating that may adversely affect the operating parameters of the acoustic wave resonator 10. It may thus be desirable to provide a path for heat to flow away from the IDT electrodes 14.

Figure 4:
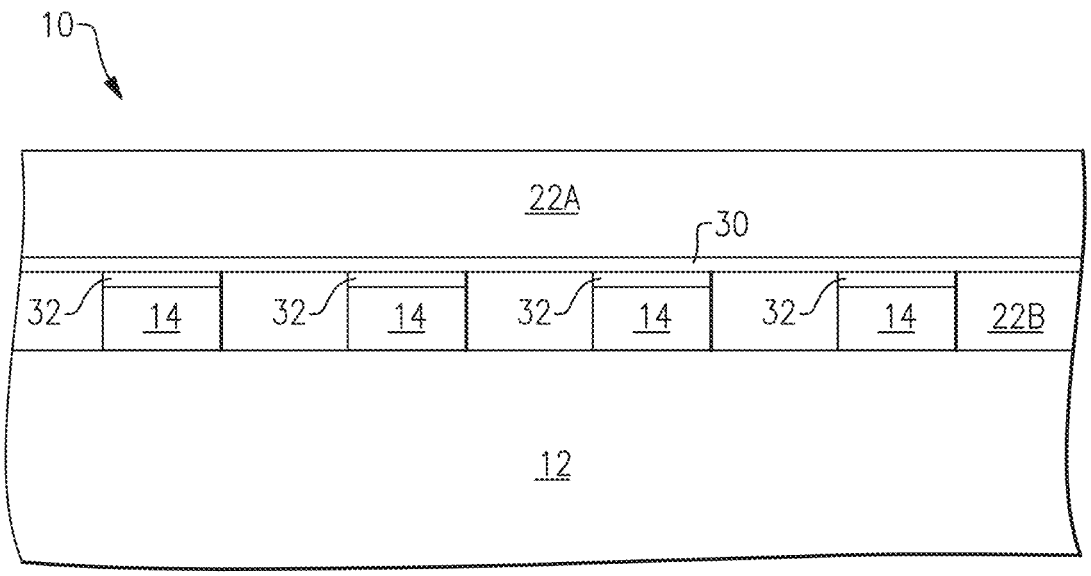
FIG. 4 is a cross-sectional view of a portion of a surface acoustic wave resonator including a layer of heat dissipating material.

One method and structure for enhancing heat dissipation from the IDT electrodes 14 in an acoustic wave resonator 10 is illustrated in FIG. 4. The method involves adding a layer of material 30 having a higher thermal conductivity than that of the dielectric material 22 on top of the IDT electrodes 14. The layer of material 30 may be referred to as a heat dissipating layer. A cap layer 32, which may be made from the same or a different material 25 than that of the layer of material 30 may include multiple sub-sections formed on top of the IDT electrodes 14 to provide thermal contact between the IDT electrodes 14 and the layer of material 30. The combination of the layer of material 30 and the cap layer 32 may be referred to as a thermally conductive bridge herein. The cap layer 32 may also serve other purposes, for example, it may serve as an etch stop layer in manufacturing processes in 30 which the layer of dielectric material 22 is flattened by chemical mechanical polishing. The layer of material 20 may divide the dielectric material 22 into an upper portion 22A and a lower portion 22B. The upper portion 22A and lower portion 22B may have the same composition, but in some embodiments may have different compositions. For example, one of upper portion 22A and lower portion 22B may include more nitrogen than the other of the upper portion 22A and lower portion 22B and be considered a silicon oxynitride layer. Additionally or alternatively, one of the upper portion 22A and lower portion 22B may include more or different dopants or impurities than the other of the upper portion 22A and lower portion 22B.

Figure 5:
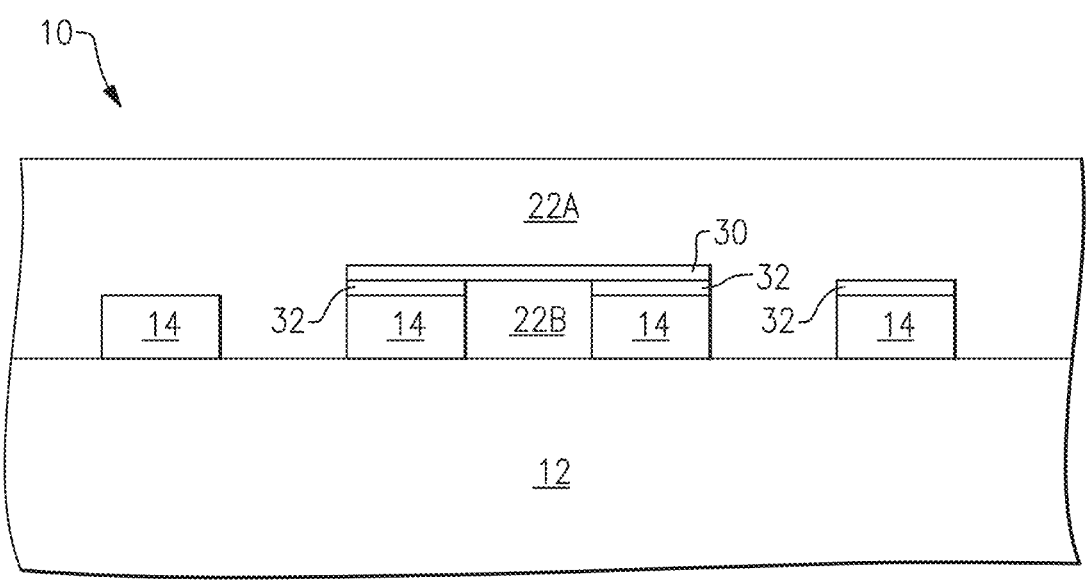
FIG. 5 is a cross-sectional view of a portion of another surface acoustic wave resonator including a layer of heat dissipating material.

In some embodiments, the layer of material 30 may be disposed over substantially all or all IDT electrodes 14, 24 in a SAW or Lamb mode resonator. Alternatively, the layer of material 30 may be disposed over only a portion of the IDT electrodes 14, 24 in a SAW or Lamb mode resonator, for example as illustrated in FIG. 5. The layer of material 30 may be broken into multiple sub-sections, each sub-section disposed over non-adjacent pairs, non-adjacent triplets, or non-adjacent groups of greater numbers of the IDT electrodes 14. IDT electrodes over which the layer of material 30 is not disposed may either include or not include the cap layer 32.

The layer of material 30, as well as the cap layer 32 may be formed of a material having a high electrical resistivity so that it does not cause electrical shorts between different of the IDT electrodes 14 in a SAW device. The layer of material 30, as well as the cap layer 32 may be formed of a ceramic material. The layer of material 30, as well as the cap layer 32 may be formed of, for example, silicon nitride ($Si_3N_4$), which has a thermal conductivity of about 30 W/mK. The layer of material 30 and/or the cap layer 32 may additionally or alternatively include or consist of other materials having a higher thermal conductivity than that of the dielectric material 22, for example, aluminum nitride (thermal conductivity of about 140-180 W/mK), aluminum oxide (thermal conductivity of 18 W/mK), spinel ($MgAl_2O_4$, thermal conductivity of about 16 W/mK), or diamond (thermal conductivity of over 1,000 W/mK). The cap layer 32 may have a thickness of, for example, between about 10 nm and about 50 nm and the layer of material 30 may have a thickness of between about 10 nm and about 200 nm, although these values may vary based on the type of material of which these layers or formed and a desired amount of heat dissipation for a particular SAW structure. The cap layer 32 and the layer of material 30 may both be thinner than both the IDT electrodes 14 and the layer of dielectric material 22 or upper or lower portions 22A, 22B of the layer of dielectric material 22.

Figure 6:
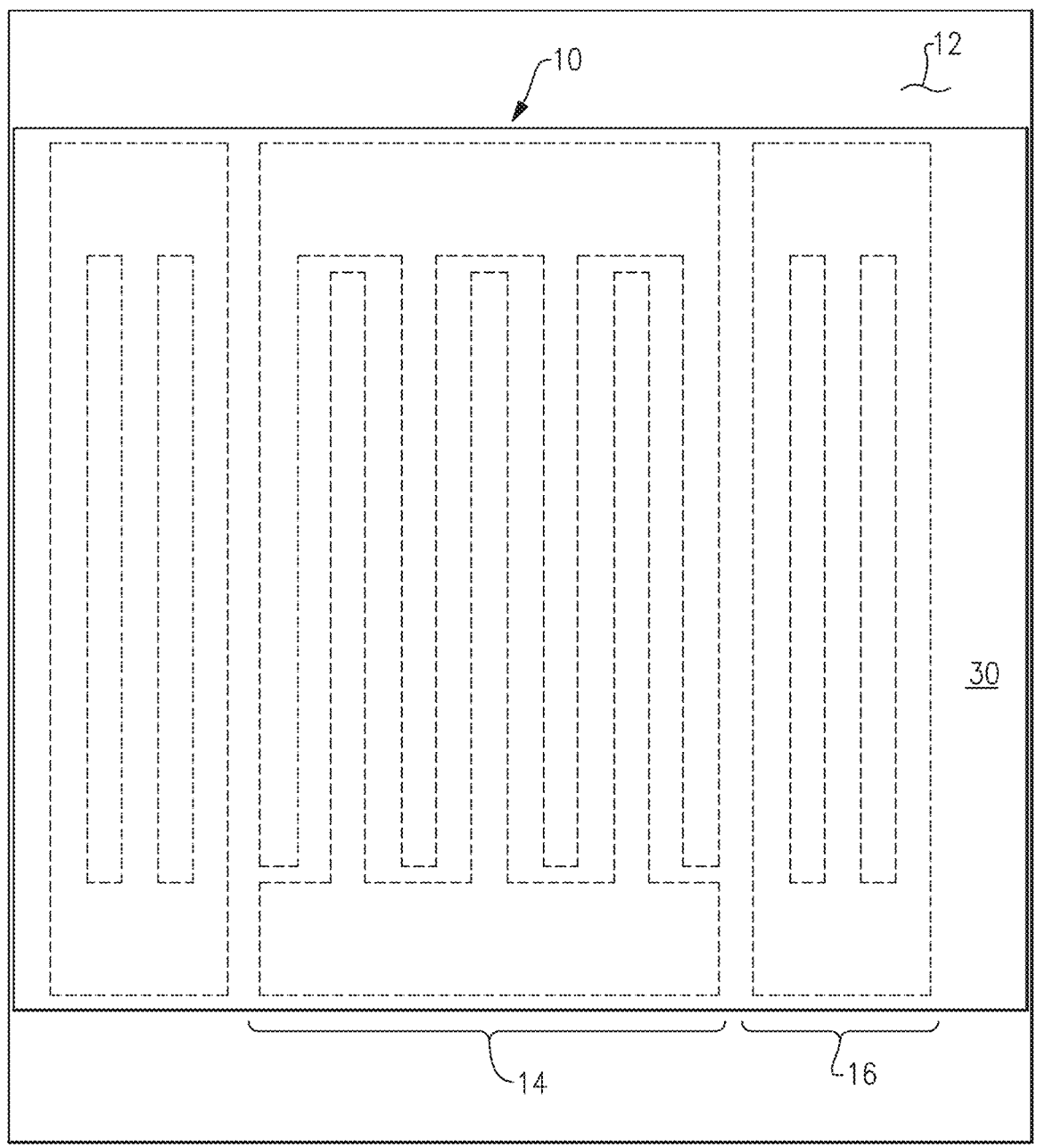
FIG. 6 illustrates a configuration of coverage of a layer of heat dissipating material on a surface acoustic wave resonator.
Figure 7:
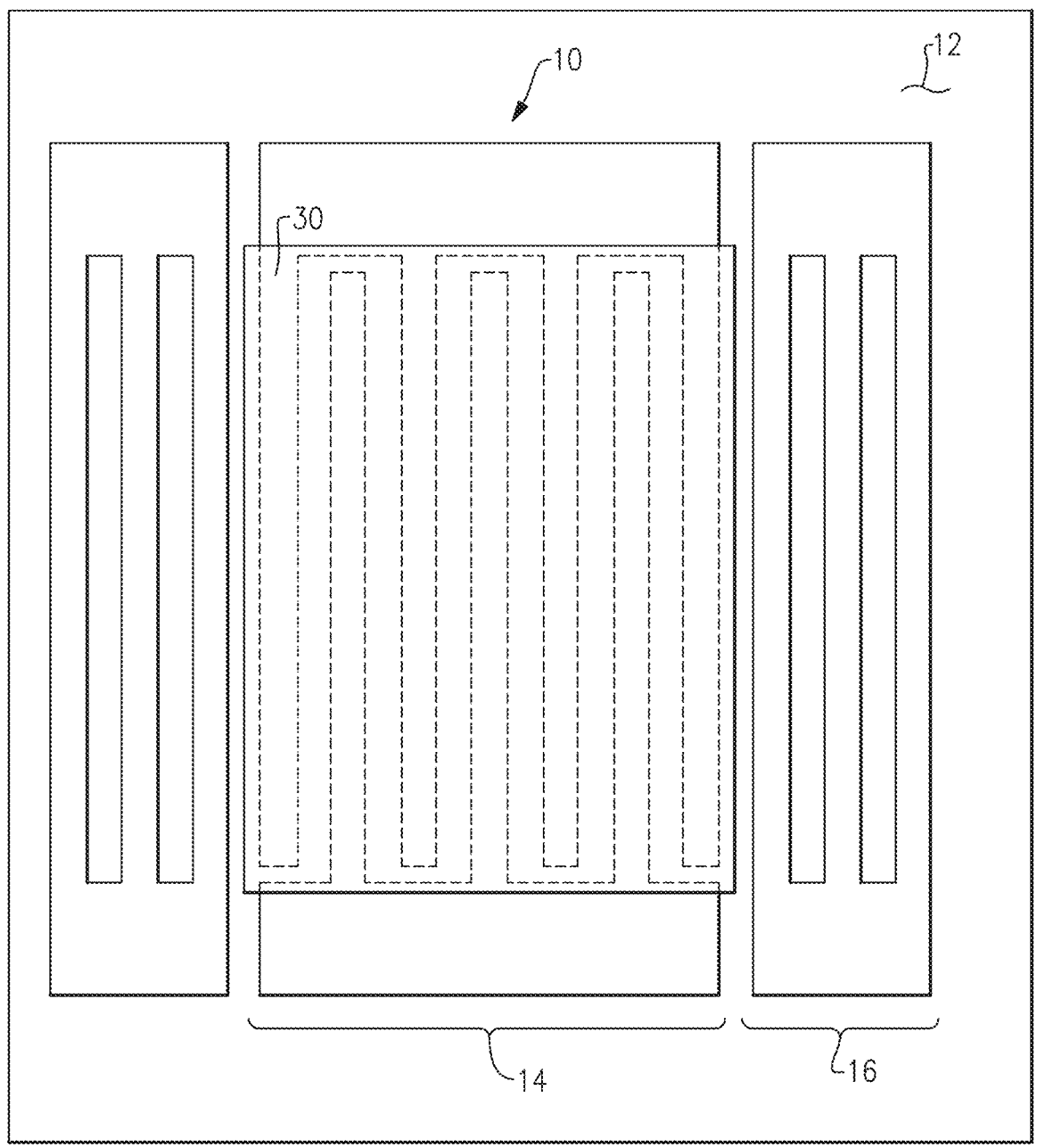
FIG. 7 illustrates another configuration of coverage of a layer of heat dissipating material on a surface acoustic wave resonator.
Figure 8:
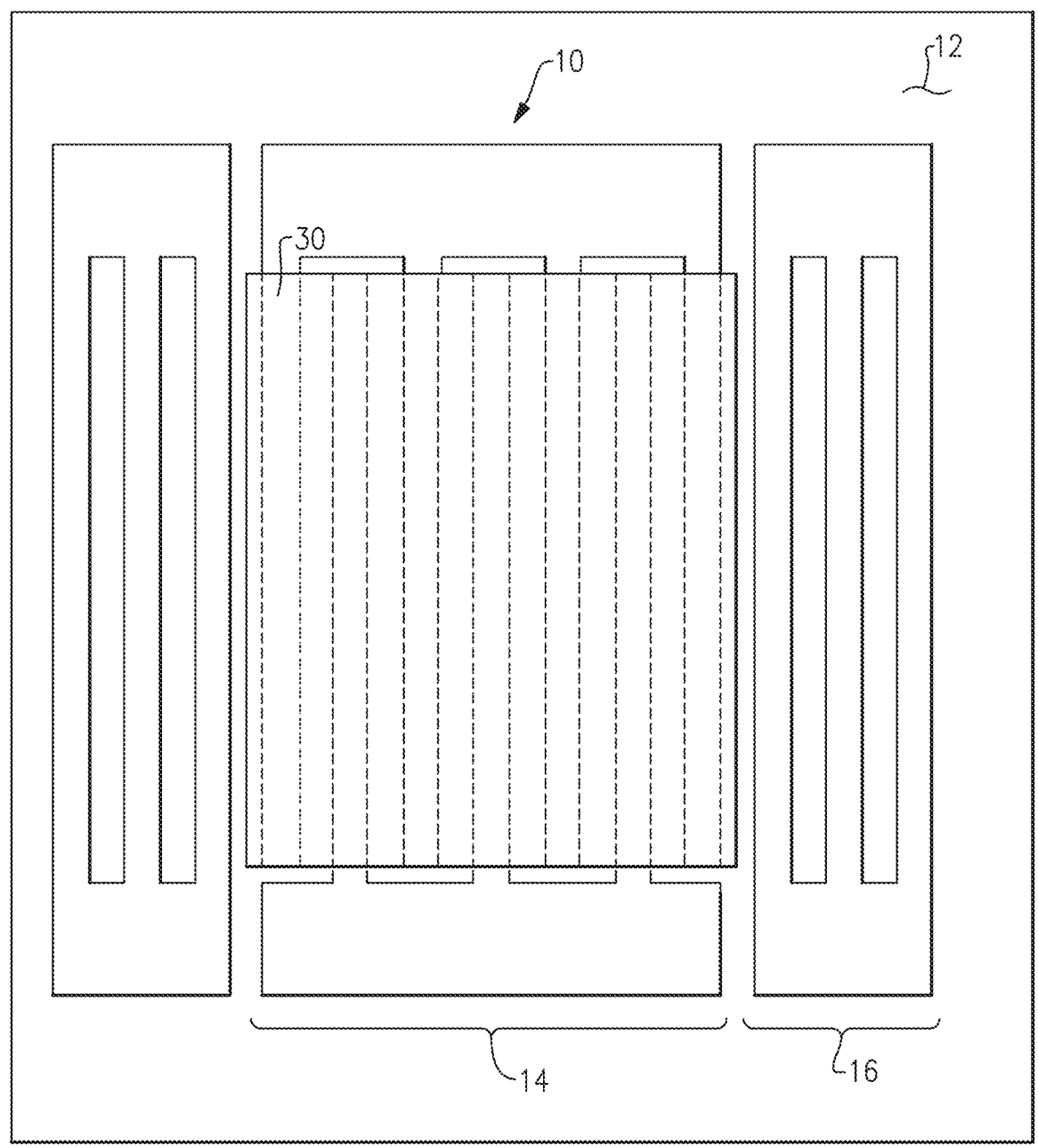
FIG. 8 illustrates another configuration of coverage of a layer of heat dissipating material on a surface acoustic wave resonator.
Figure 9:
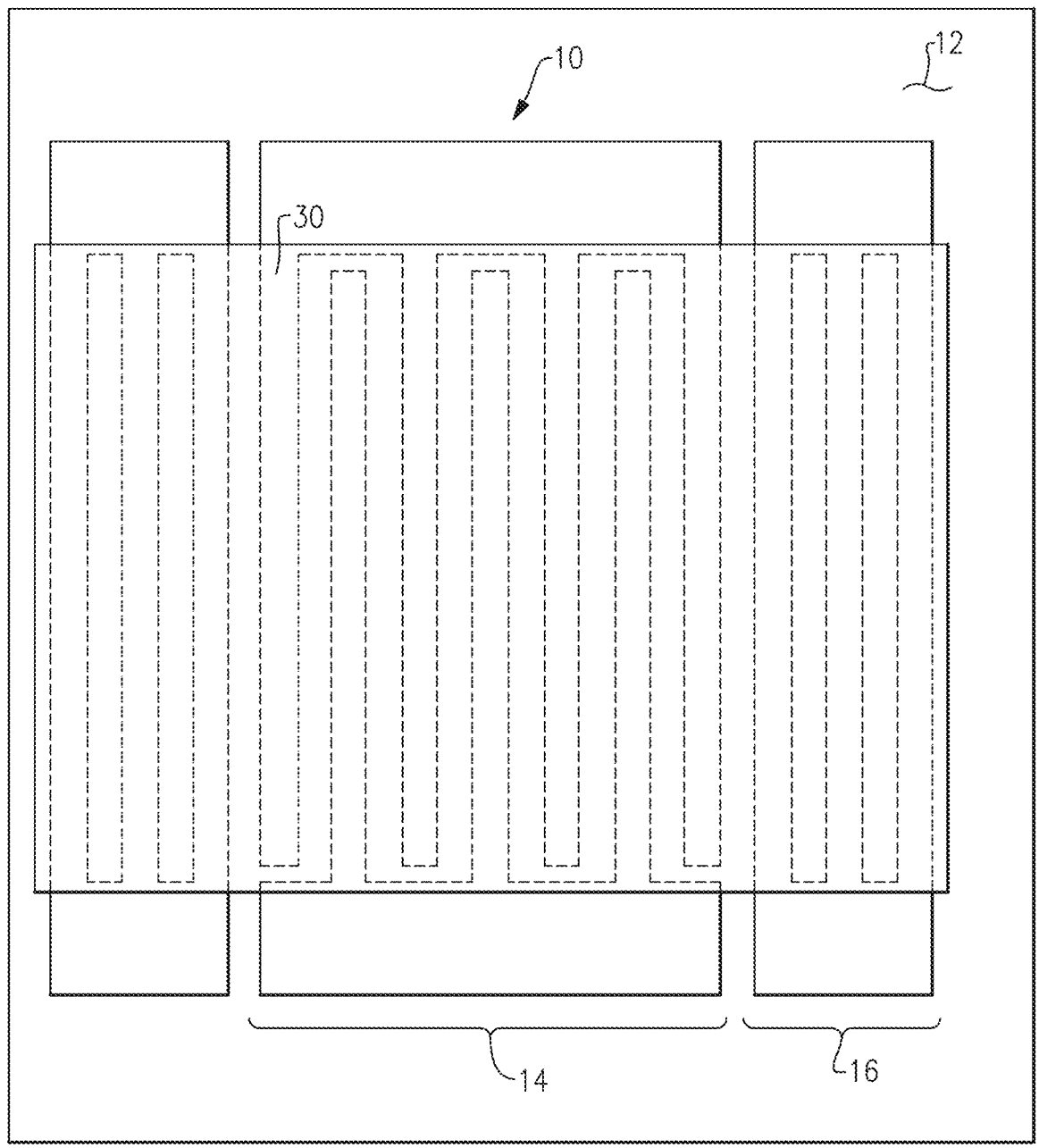
FIG. 9 illustrates another configuration of coverage of a layer of heat dissipating material on a surface acoustic wave resonator.
Figure 10:
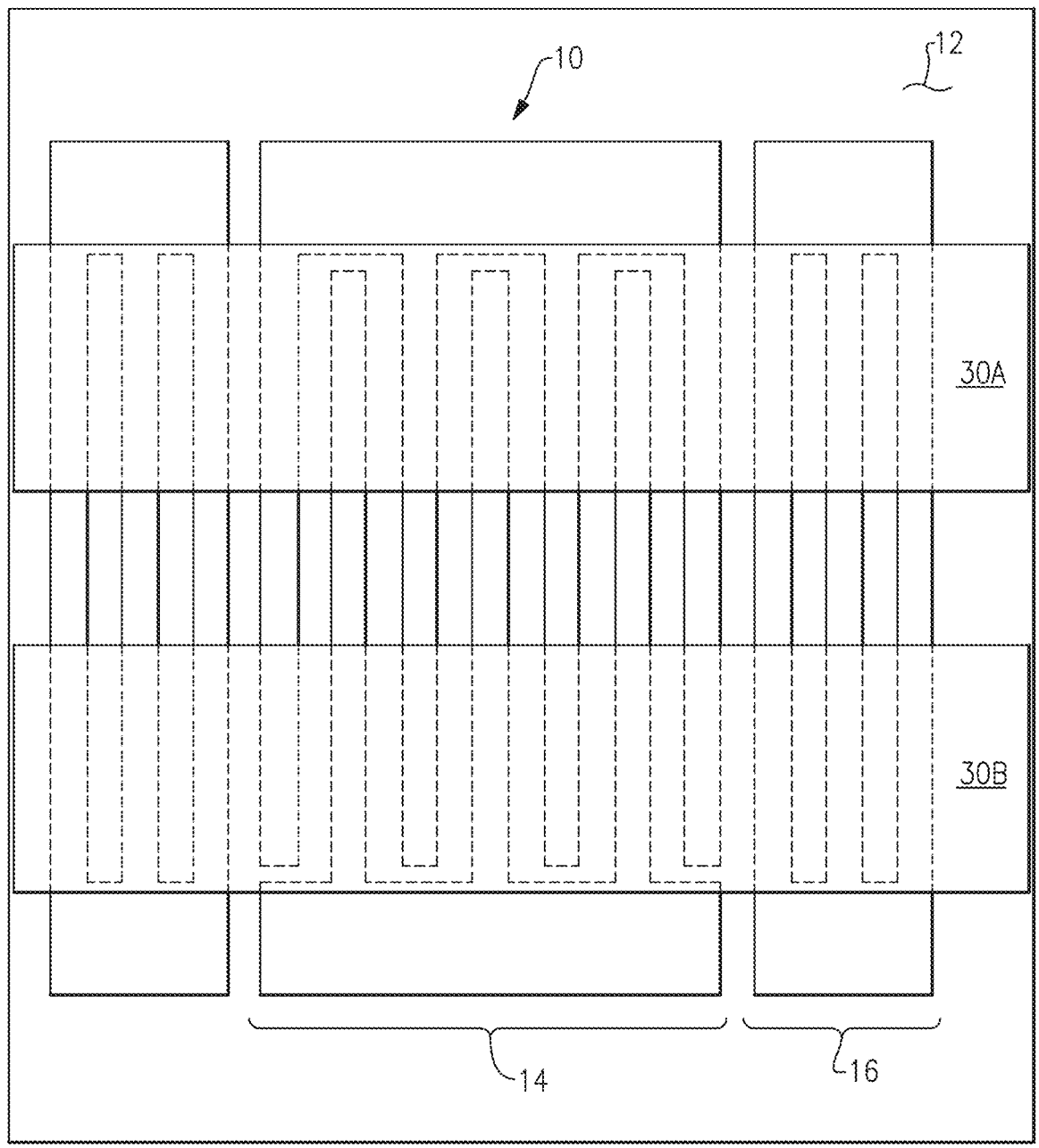
FIG. 10 illustrates another configuration of coverage of a layer of heat dissipating material on a surface acoustic wave resonator.

In some embodiments, for example, as illustrated in FIG. 6, the material layer 30 may be disposed over the entirety of the acoustic wave resonator 10, including over the IDT electrodes 14 bus bars and reflector electrodes 16. The material layer 30 may be in the form of a contiguous film that covers multiple acoustic wave resonators 10 formed on the same substrate 12 and may extend across an entire die including multiple acoustic wave resonators 10. In other embodiments, for example, as illustrated in FIG. 7, the material layer 30 covers only the area in which the IDT electrodes 14 are interleaved, and optionally a portion of the bus bars, and does not extend over the reflector electrodes 16. In some embodiments, as illustrated in FIG. 8, the material layer 30 covers only the area in which the IDT electrodes 14 are interleaved. In other embodiments, for example, as illustrated in FIG. 9, the material layer 30 covers the area in which the IDT electrodes 14 are interleaved, and optionally a portion of the bus bars, and also extends over the reflector electrodes 16. In some embodiments, for example, as illustrated in FIG. 10, the material layer 30 may include two or more separate film layers 30A, 30B that cover different portions of an acoustic wave resonator 10. Any combination of the coverage configurations of the material layer 30 illustrated in FIGS. 6-10 may also be provided.

Figure 11:
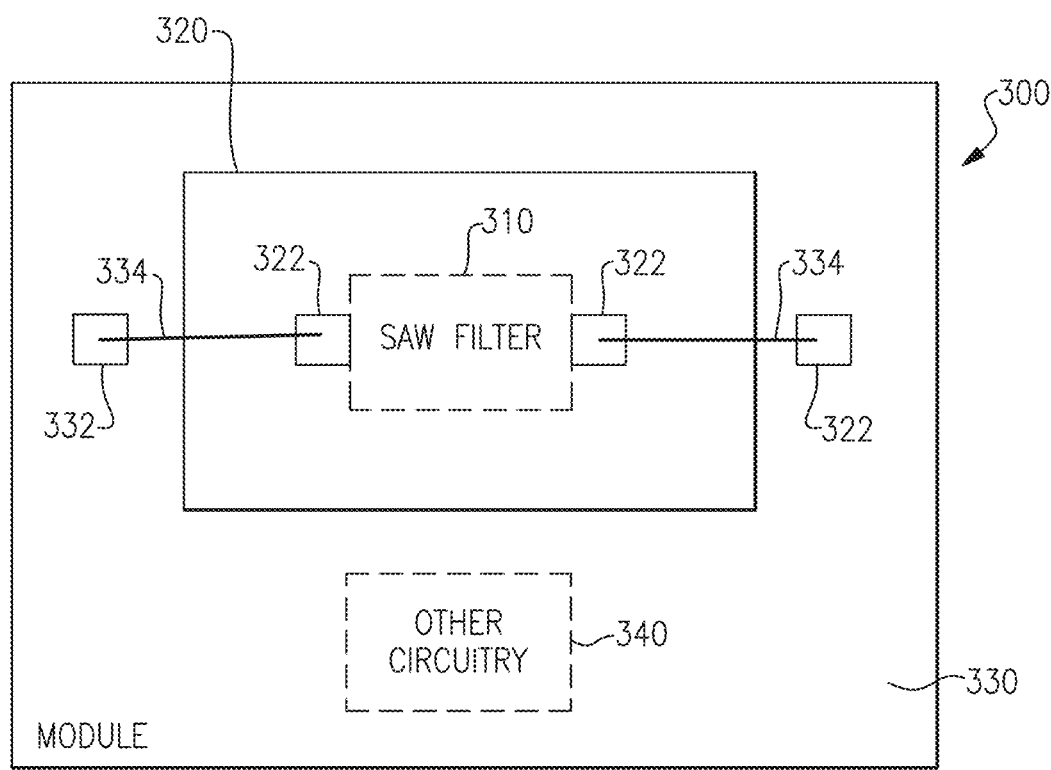
FIG. 11 is a block diagram of one example of a filter module that can include one or more surface acoustic wave elements according to aspects of the present disclosure.
Figure 12:
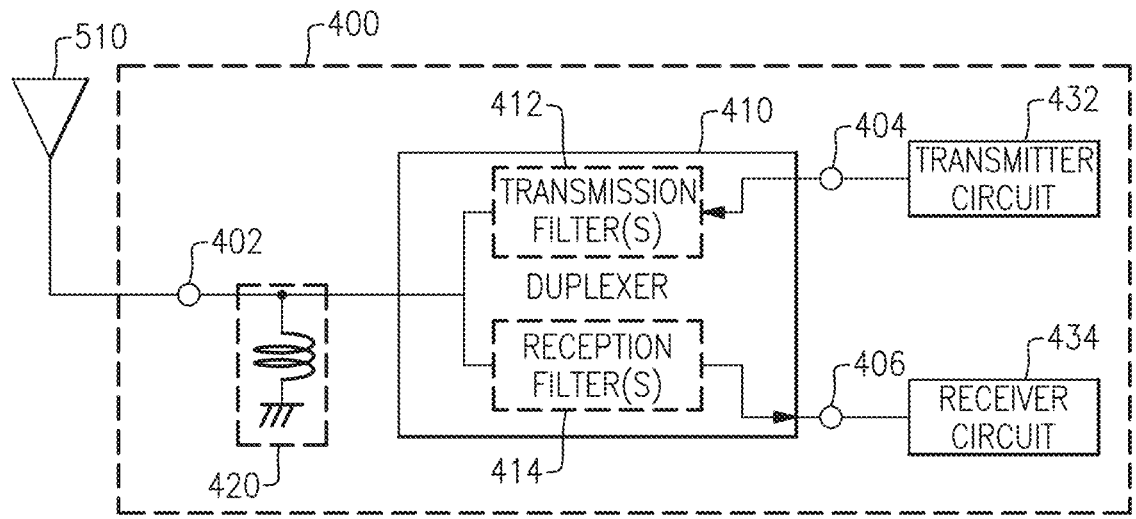
FIG. 12 is a block diagram of one example of a front-end module that can include one or more filter modules according to aspects of the present disclosure.
Figure 13:
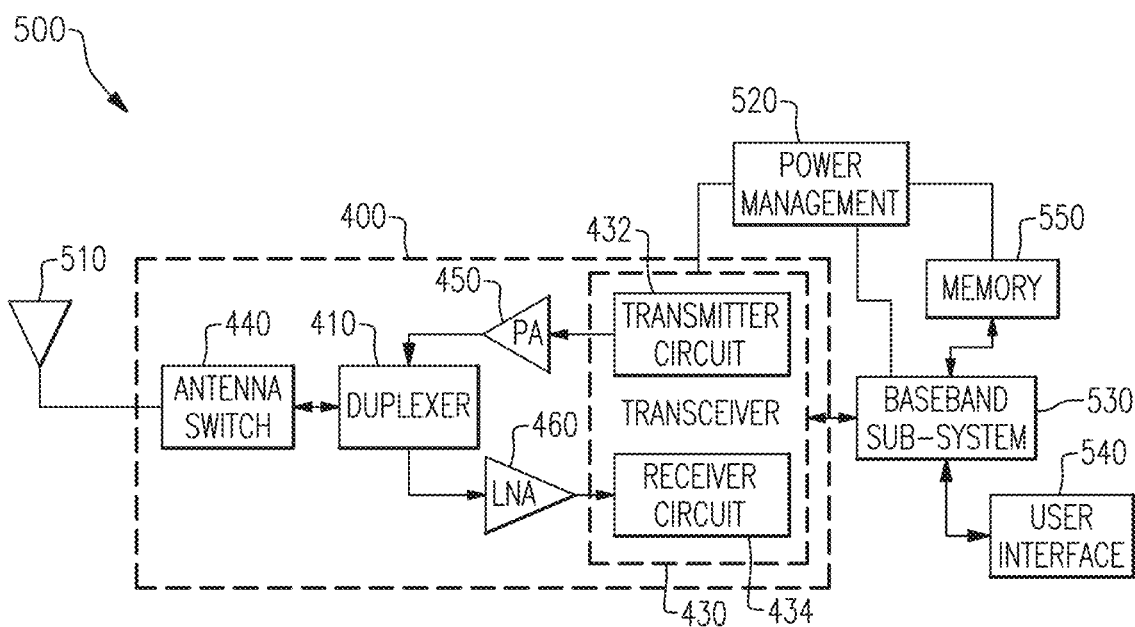
FIG. 13 is a block diagram of one example of a wireless device including the front-end module of FIG. 12.
Figure 14:
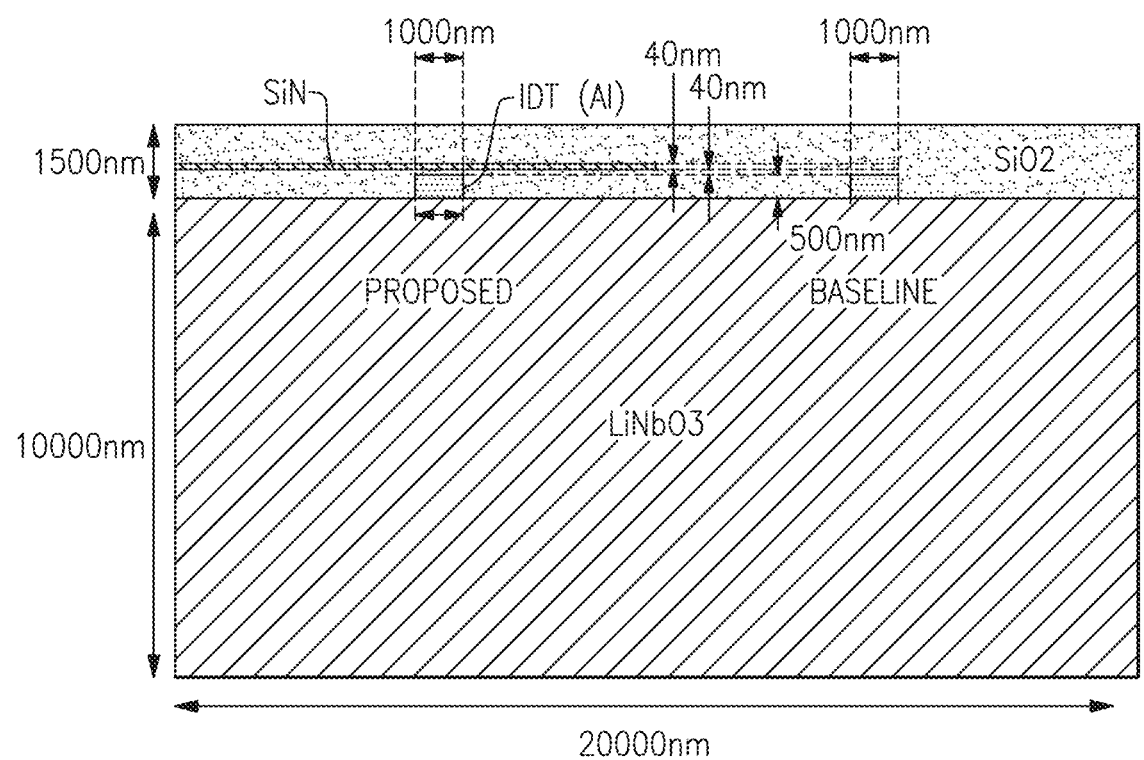
FIG. 14 illustrates material and dimensions utilized in a simulation comparing heat flux from an IDT electrode and temperature distribution about an IDT electrode with and without a heat dissipation layer covering the IDT electrode.

The surface acoustic wave devices discussed herein can be implemented in a variety of packaged modules. Some example packaged modules will now be discussed in which any suitable principles and advantages of the packaged acoustic wave devices discussed herein can be implemented. FIGS. 11, 12, and 13 are schematic block diagrams of illustrative packaged modules and devices according to certain embodiments.

As discussed above, embodiments of the surface acoustic wave elements can be configured as or used in filters, for example. In turn, a surface acoustic wave (SAW) filter using one or more surface acoustic wave elements may be incorporated into and packaged as a module that may ultimately be used in an electronic device, such as a wireless communications device, for example. FIG. 11 is a block diagram illustrating one example of a module 300 including a SAW filter 310. The SAW filter 310 may be implemented on one or more die(s) 320 including one or more connection pads 322. For example, the SAW filter 310 may include a connection pad 322 that corresponds to an input contact for the SAW filter and another connection pad 322 that corresponds to an output contact for the SAW filter. The packaged module 300 includes a packaging substrate 330 that is configured to receive a plurality of components, including the die 320. A plurality of connection pads 332 can be disposed on the packaging substrate 330, and the various connection pads 322 of the SAW filter die 320 can be connected to the connection pads 332 on the packaging substrate 330 via electrical connectors 334, which can be solder bumps or wirebonds, for example, to allow for passing of various signals to and from the SAW filter 310. The module 300 may optionally further include other circuitry die 340, such as, for example one or more additional filter(s), amplifiers, pre-filters, modulators, demodulators, down converters, and the like, as would be known to one of skill in the art of semiconductor fabrication in view of the disclosure herein. In some embodiments, the module 300 can also include one or more packaging structures to, for example, provide protection and facilitate easier handling of the module 300. Such a packaging structure can include an overmold formed over the packaging substrate 330 and dimensioned to substantially encapsulate the various circuits and components thereon.

Various examples and embodiments of the SAW filter 310 can be used in a wide variety of electronic devices. For example, the SAW filter 310 can be used in an antenna duplexer, which itself can be incorporated into a variety of electronic devices, such as RF front-end modules and communication devices.

Referring to FIG. 12, there is illustrated a block diagram of one example of a front-end module 400, which may be used in an electronic device such as a wireless communications device (e.g., a mobile phone) for example. The front-end module 400 includes an antenna duplexer 410 having a common node 402, an input node 404, and an output node 406. An antenna 510 is connected to the common node 402.

The antenna duplexer 410 may include one or more transmission filters 412 connected between the input node 404 and the common node 402, and one or more reception filters 414 connected between the common node 402 and the output node 406. The passband(s) of the transmission filter(s) are different from the passband(s) of the reception filters. Examples of the SAW filter 310 can be used to form the transmission filter(s) 412 and/or the reception filter(s) 414. An inductor or other matching component 420 may be connected at the common node 402.

The front-end module 400 further includes a transmitter circuit 432 connected to the input node 404 of the duplexer 410 and a receiver circuit 434 connected to the output node 406 of the duplexer 410. The transmitter circuit 432 can generate signals for transmission via the antenna 510, and the receiver circuit 434 can receive and process signals received via the antenna 510. In some embodiments, the receiver and transmitter circuits are implemented as separate components, as shown in FIG. 12, however in other embodiments these components may be integrated into a common transceiver circuit or module. As will be appreciated by those skilled in the art, the front-end module 400 may include other components that are not illustrated in FIG. 12 including, but not limited to, switches, electromagnetic couplers, amplifiers, processors, and the like.

FIG. 13 is a block diagram of one example of a wireless device 500 including the antenna duplexer 410 shown in FIG. 12. The wireless device 500 can be a cellular phone, smart phone, tablet, modem, communication network or any other portable or non-portable device configured for voice or data communication. The wireless device 500 can receive and transmit signals from the antenna 510. The wireless device includes an embodiment of a front-end module 400 similar to that discussed above with reference to FIG. 12. The front-end module 400 includes the duplexer 410, as discussed above. In the example shown in FIG. 13 the front-end module 400 further includes an antenna switch 440, which can be configured to switch between different frequency bands or modes, such as transmit and receive modes, for example. In the example illustrated in FIG. 13, the antenna switch 440 is positioned between the duplexer 410 and the antenna 510; however, in other examples the duplexer 410 can be positioned between the antenna switch 440 and the antenna 510. In other examples the antenna switch 440 and the duplexer 410 can be integrated into a single component.

The front-end module 400 includes a transceiver 430 that is configured to generate signals for transmission or to process received signals. The transceiver 430 can include the transmitter circuit 432, which can be connected to the input node 404 of the duplexer 410, and the receiver circuit 434, which can be connected to the output node 406 of the duplexer 410, as shown in the example of FIG. 12.

Signals generated for transmission by the transmitter circuit 432 are received by a power amplifier (PA) module 450, which amplifies the generated signals from the transceiver 430. The power amplifier module 450 can include one or more power amplifiers. The power amplifier module 450 can be used to amplify a wide variety of RF or other frequency-band transmission signals. For example, the power amplifier module 450 can receive an enable signal that can be used to pulse the output of the power amplifier to aid in transmitting a wireless local area network (WLAN) signal or any other suitable pulsed signal. The power amplifier module 450 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 450 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 13, the front-end module 400 may further include a low noise amplifier module 460, which amplifies received signals from the antenna 510 and provides the amplified signals to the receiver circuit 434 of the transceiver 430.

The wireless device 500 of FIG. 13 further includes a power management sub-system 520 that is connected to the transceiver 430 and manages the power for the operation of the wireless device 500. The power management system 520 can also control the operation of a baseband sub-system 530 and various other components of the wireless device 500. The power management system 520 can include, or can be connected to, a battery (not shown) that supplies power for the various components of the wireless device 500. The power management system 520 can further include one or more processors or controllers that can control the transmission of signals, for example. In one embodiment, the baseband sub-system 530 is connected to a user interface 540 to facilitate various input and output of voice and/or data provided to and received from the user. The baseband sub-system 530 can also be connected to memory 550 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 300 GHz, such as in a range from about 450 MHz to 6 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

EXAMPLE

Simulations were performed to determine how a silicon nitride heat dissipation layer as disclosed herein affected heat flux from an IDT electrode and temperature distribution about an IDT electrode. Details regarding the materials and dimensions of the simulated structure are provided in FIG. 12. As shown in FIG. 12, the IDT electrodes are formed of aluminum and have a thickness of approximately 500 nm, the cap layer on the "Proposed" IDT electrode (corresponding to layer 32 in FIG. 4) and the layer of SiN (corresponding to the layer of material 30 in FIG. 4) each have a thickness of approximately 40 nm. The layer of $SiO_2$ (corresponding to layer of dielectric material 22 made of sublayers 22A and 22B in FIG. 4) covering the IDT electrodes and the $LiNbO_3$ substrate has a total thickness of about 1,500 nm as measured from the surface of the substrate. The $LiNbO_3$ substrate having a thickness of about 10,000 nm.

Figure 15:
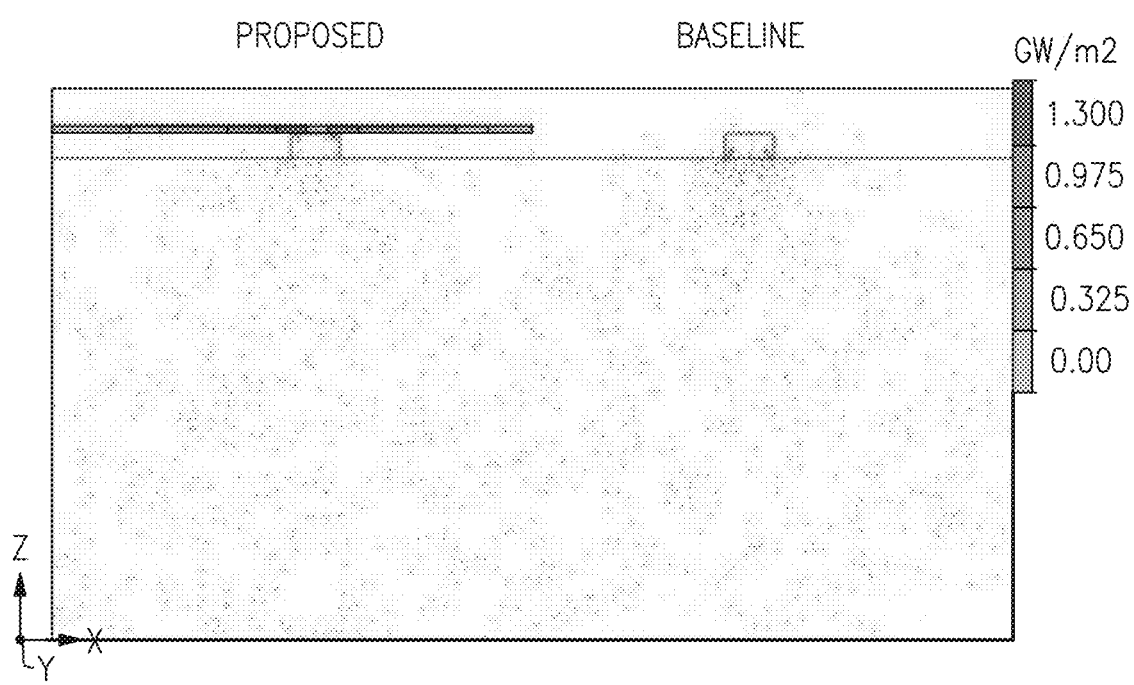
FIG. 15 illustrates results of the simulation comparing heat flux from an IDT electrode with and without a heat dissipation layer covering the IDT electrode.
Figure 16:
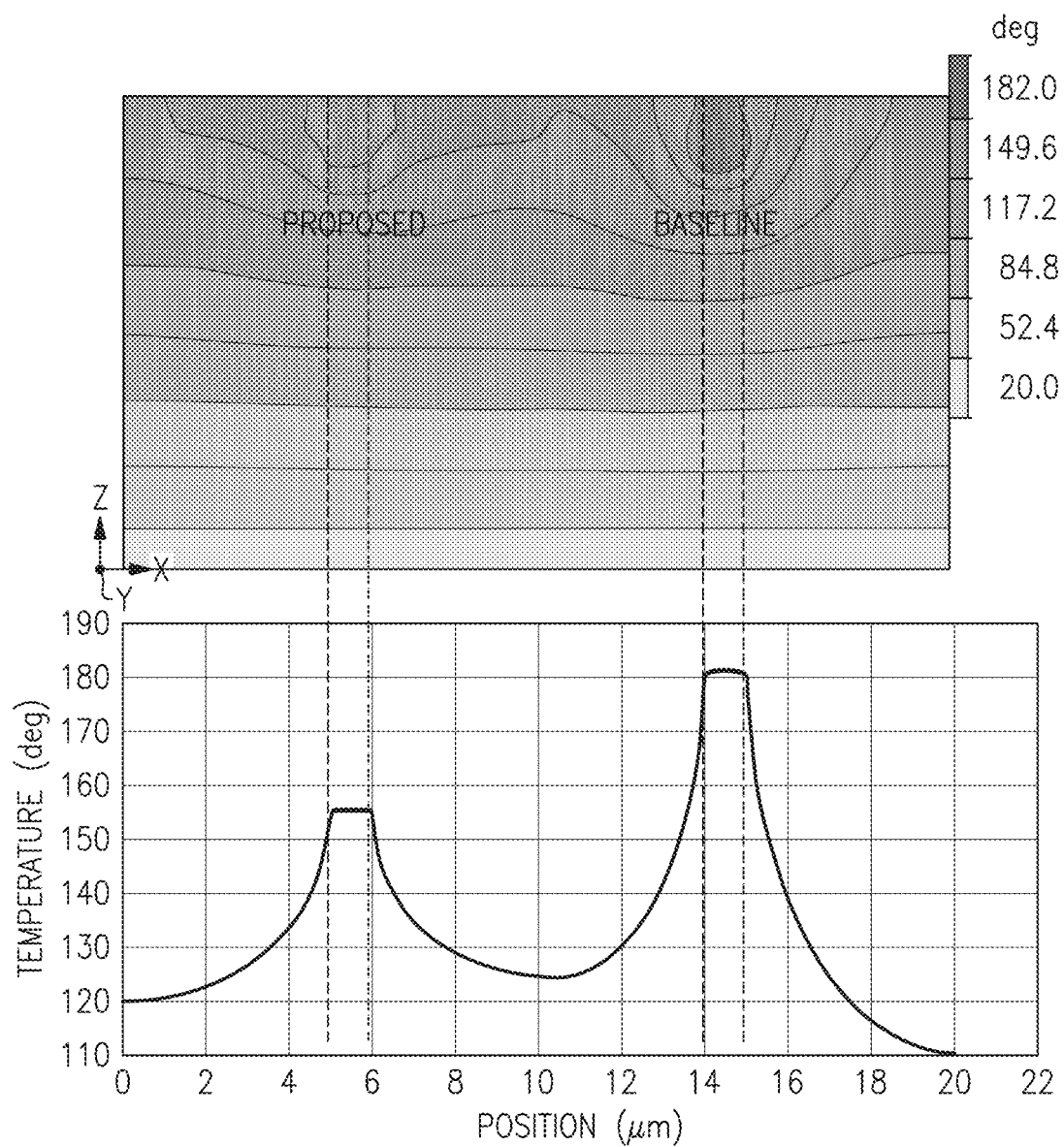
FIG. 16 illustrates results of the simulation comparing temperature distribution about an IDT electrode with and without a heat dissipation layer covering the IDT electrode.

The results of these simulations are illustrated in FIGS. 15 and 16, in which the "Baseline" configuration includes an IDT electrode not covered by a heat dissipation layer and the "Proposed" configuration included IDT electrode not covered by a heat dissipation layer.

As illustrated in FIG. 15 heat flux through the heat dissipation layer was greatest (about 1.3 $GW/m^2$) at portions of the heat dissipation layer immediately adjacent the IDT electrode which it covered. The presence of the heat dissipation layer reduced the amount of heat flux into the substrate. The heat flux into the substrate for the "Proposed" IDT electrode was significantly diminished relative to the heat flux in to the substrate from the "Baseline" IDT electrode. The heat flux from the "Proposed" IDT electrode was primarily into the heat dissipation layer from the upper corners of the IDT electrode, while heat flux from the "Baseline" IDT electrode was primarily into the substrate from the lower corners of the IDT electrode.

As illustrated in FIG. 16, the heat dissipation layer in the "Proposed" configuration both increased the degree to which heat travelled away from the IDT electrode and reduced the temperature at the IDT electrode as compared to the "Baseline" configuration. In the "Baseline" configuration temperatures within and immediately surrounding the IDT electrode reached about 180° C., while in the "proposed" configuration temperatures within and immediately surrounding the IDT electrode reached about 155° C., an improvement of 25° C.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An acoustic wave device comprising:
   a piezoelectric substrate;
   interdigital transducer electrodes including electrode fingers disposed on an upper surface of the substrate;
   a dielectric material layer disposed on the upper surface of the substrate and between the interdigital transducer electrode fingers; and
   a thermally conductive bridge disposed within the dielectric material layer and contacting upper surfaces of at least two adjacent interdigital transducer electrode fingers to dissipate heat therefrom.

2. The acoustic wave device of claim 1 wherein the thermally conductive bridge includes cap layers disposed on the upper surfaces of the at least two adjacent interdigital transducer electrode fingers.

3. The acoustic wave device of claim 2 wherein the cap layers include a material having a higher thermal conductivity than the dielectric material.

4. The acoustic wave device of claim 2 wherein a first portion of the dielectric material disposed on the upper surface of the substrate and between the interdigital transducer electrode fingers has a different composition than a second portion of the dielectric material disposed above the interdigital transducer electrode fingers.

5. The acoustic wave device of claim 2 wherein the cap layers have same widths as respective ones of the interdigital transducer electrode fingers upon which they are disposed, the widths being measured in a direction parallel to a direction of propagation of a main acoustic wave through the acoustic wave device.

6. The acoustic wave device of claim 2 wherein the cap layers are thinner than the interdigital transducer electrodes and thinner than the dielectric material layer.

7. The acoustic wave device of claim 6 wherein the cap layers are between 10 nm and 50 nm thick.

8. The acoustic wave device of claim 2 wherein the thermally conductive bridge further includes a heat dissipating layer disposed on and extending between the cap layers.

9. The acoustic wave device of claim 8 wherein the heat dissipating layer includes a material having a higher thermal conductivity than the dielectric material.

10. The acoustic wave device of claim 8 wherein the heat dissipating layer is formed of a different material than the cap layers.

11. The acoustic wave device of claim 8 wherein the heat dissipating layer is formed of a same material as the cap layers.

12. The acoustic wave device of claim 8 wherein the heat dissipating layer has an electrical resistance sufficiently high to prevent short circuits between adjacent interdigital transducer electrodes though the heat dissipating layer.

13. The acoustic wave device of claim 12 wherein the heat dissipating layer is formed of a ceramic material.

14. The acoustic wave device of claim 13 wherein the heat dissipating layer is formed of one of silicon nitride, aluminum nitride, aluminum oxide, spinel, or diamond.

15. The acoustic wave device of claim 8 wherein the heat dissipating layer is thinner than the interdigital transducer electrodes and thinner than the dielectric material layer.

16. The acoustic wave device of claim 15 wherein the heat dissipating layer is between 10 nm and 200 nm thick.

17. The acoustic wave device of claim 8 wherein the heat dissipating layer is disposed between a first portion of the dielectric material and a second portion of the dielectric material, the first portion of the dielectric material being disposed on the upper surface of the substrate and between the interdigital transducer electrode fingers, the second portion of the dielectric material being disposed above the interdigital transducer electrode fingers.

18. The acoustic wave device of claim 1 wherein the thermally conductive bridge covers an area in which the interdigital transducer electrodes are interleaved.

19. The acoustic wave device of claim 18 wherein the thermally conductive bridge further covers portions of bus bar electrodes from which the interdigital transducer electrodes extend.

20. The acoustic wave device of claim 18 wherein the thermally conductive bridge further covers reflector electrodes disposed on opposite sides of the interdigital transducer electrodes.

21. The acoustic wave device of claim 1 wherein the thermally conductive bridge includes a plurality of separate heat dissipating layers covering different respective portions of the interdigital transducer electrodes.

22. A radio frequency filter including the acoustic wave device of claim 1.

23. An electronics module including the radio frequency filter of claim 22.

24. An electronic device including the electronics module of claim 23.

* * * * *